United States Patent
Haselby et al.

(10) Patent No.: US 7,447,043 B2
(45) Date of Patent: Nov. 4, 2008

(54) POWER CABLING ASSEMBLY

(75) Inventors: Jeffrey Todd Haselby, Fort Collins, CO (US); Eric C. Peterson, McKinney, TX (US); Shaun Lee Harris, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 276 days.

(21) Appl. No.: 10/743,611

(22) Filed: Dec. 22, 2003

(65) Prior Publication Data

US 2005/0135076 A1 Jun. 23, 2005

(51) Int. Cl.
*H05K 7/14* (2006.01)
*H05K 7/18* (2006.01)

(52) U.S. Cl. ...................... 361/801; 361/825

(58) Field of Classification Search ............... 361/752, 361/797, 807, 810, 825, 729, 683–685; 174/151–152; 439/562, 565, 553, 544, 620.26, 620.34
See application file for complete search history.

(56) References Cited

U.S. PATENT DOCUMENTS

| | | | |
|---|---|---|---|
| 2,873,331 A * | 2/1959 | Hans ........................... 218/43 |
| 3,965,397 A * | 6/1976 | Pearsall, Jr. .................. 361/837 |
| 4,616,207 A * | 10/1986 | Knapp et al. .............. 338/32 H |
| 5,434,740 A * | 7/1995 | Chan ........................... 361/118 |
| 5,641,953 A * | 6/1997 | Fisher, Jr. ................ 200/50.12 |
| 6,441,304 B1 * | 8/2002 | Currier et al. .................. 174/53 |
| 6,755,686 B2 * | 6/2004 | Scherer et al. .............. 439/564 |
| 6,875,052 B1 * | 4/2005 | Lo et al. ..................... 439/564 |
| 2004/0077214 A1 * | 4/2004 | Turek et al. .................. 439/565 |

\* cited by examiner

*Primary Examiner*—Hung S Bui

(57) ABSTRACT

A fused power cable assembly and method of integrating a protective device with a power source connector retaining bracket. A bracket assembly having a bulkhead retaining element, a protective device element, and a retaining element operable to couple the protective device to the bracket allows for mounting of protective device(s) to the bracket instead of the bulkhead, thereby saving space. A power cabling assembly having a bracket assembly, a power connector, and a fastening element operable to couple the power connector to the bulkhead and the bulkhead to the bracket assembly, allowing assembly of the power cabling assembly prior to installation into target equipment.

24 Claims, 6 Drawing Sheets

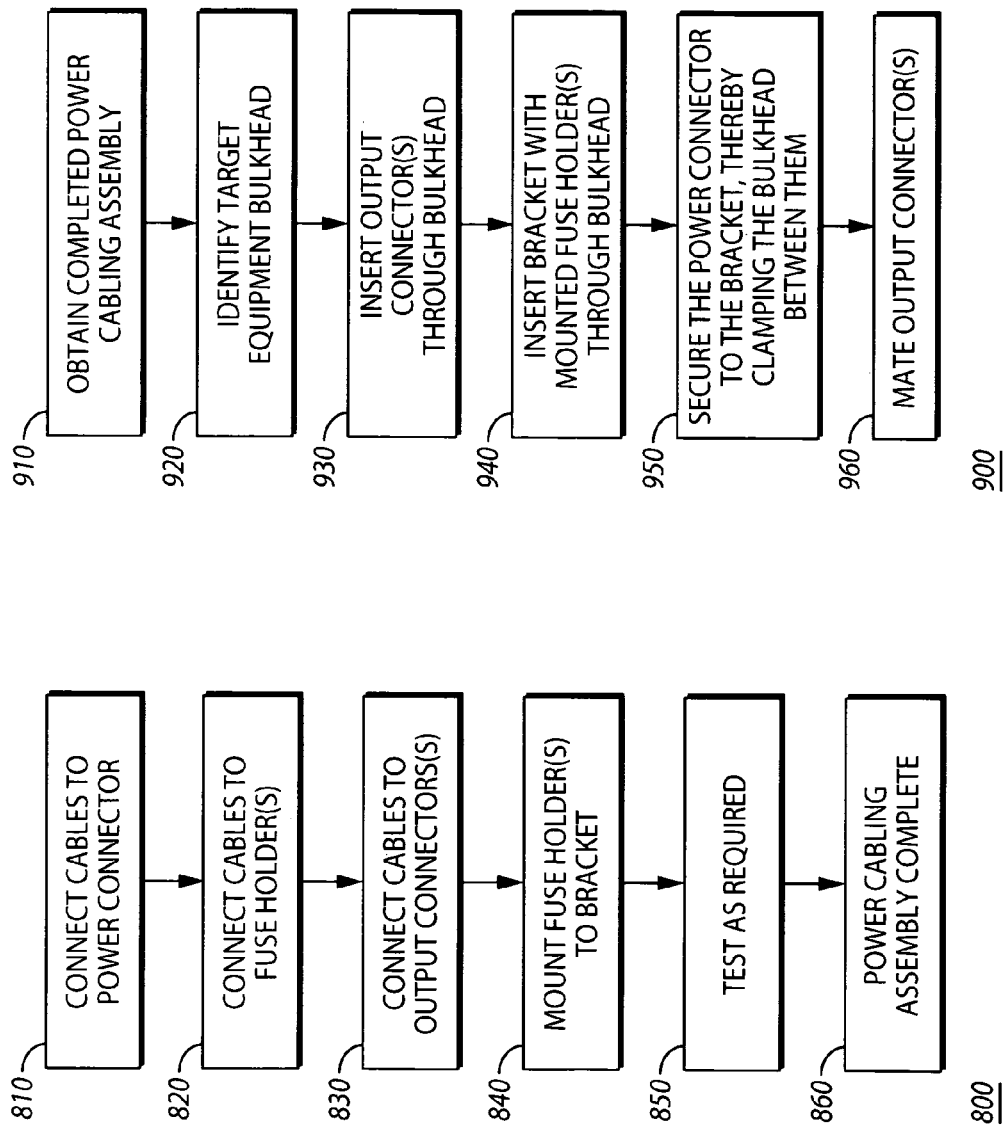

POWER CABLING ASSEMBLY

FIELD OF THE INVENTION

This invention relates generally to the field of power cable assemblies. More particularly, this invention relates to power cable assemblies that are particularly applicable to manufacturing efficiency in limited spaces.

BACKGROUND

The need to interface between a power source and loads to be powered has always been basic to applied electricity. The interface has consisted of a power connector for receiving incoming power via a mating connector, a fuse, and an output connector with cabling for routing power to loads.

The line of demarcation, the point along which the power connector is located, is the physical boundary of the assembly or subassembly. A system may have one or more power connector locations along its physical boundaries. Each point utilizes fuses, output connectors, and cabling as mentioned above.

The trend in recent decades has been toward physical equipments and components of increasingly smaller physical size. The result of this for power cabling and fusing has been the need for smaller components and the need to assemble and work with them in smaller physical spaces.

In addition, equipment reliability is of increased importance as systems grow in complexity. Reliability is enhanced if there are fewer points of connection in the power cabling assembly, and if there are fewer connections to be made within the power cabling after installation.

BRIEF SUMMARY

The present invention relates generally to power cable assemblies. Objects, advantages and features of the invention will become apparent to those skilled in the art upon consideration of the following detailed description of the invention.

In certain embodiments consistent with the present invention, a bracket assembly comprises a bulkhead retaining element, a protective device element, and a retaining element operable to couple the protective device to the bracket. In certain embodiments consistent with the present invention, a power cabling assembly comprising a bracket assembly having a protective device element integral thereto and a plurality of protective device elements integral thereto, a power connector, and an fastening element operable to couple the power connector to the bulkhead and the bulkhead to the bracket assembly, is presented.

In certain other embodiments consistent with the present invention, a power cabling assembly method to be performed external to target equipment comprises coupling a protective device element to a bracket element to form a bracket assembly having the protective device element integral thereto; coupling a plurality of power connector cable elements to a power connector; coupling a plurality of protective device cable elements to the protective device element; and coupling a plurality of output connector cable elements to a plurality of output connector elements. Moreover, a power cabling assembly installation method, in accordance with certain embodiments of the present invention comprises inserting a power cabling assembly through a receiving portion of a bulkhead, with a portion of a power connector element of the power cabling assembly remaining external to the bulkhead; coupling a bracket assembly and the power connector element to the bulkhead element utilizing the bulkhead retaining element; and coupling a plurality of output connectors to one or more mating connectors.

Many variations, equivalents and permutations of these illustrative exemplary embodiments of the invention will occur to those skilled in the art upon consideration of the description that follows. The particular examples above should not be considered to define or limit the scope of the invention.

BRIEF DESCRIPTION OF THE DRAWINGS

The features of the invention believed to be novel are set forth with particularity in the appended claims. The invention itself however, both as to organization and method of operation, together with objects and advantages thereof, may be best understood by reference to the following detailed description of the invention, which describes certain exemplary embodiments of the invention, taken in conjunction with the accompanying drawings in which:

FIG. 7 is an exemplary flowchart showing an assembly sequence for the power cabling assembly, in accordance with certain embodiments of the present invention.

FIG. 8 is an exemplary flowchart showing an assembly sequence for insertion of a completed power cabling assembly into target equipment, in accordance with certain embodiments of the present invention.

DETAILED DESCRIPTION

The present invention relates generally to power cable assemblies. Objects, advantages and features of the invention will become apparent to those skilled in the art upon consideration of the following detailed description of the invention.

A bracket assembly comprising a bulkhead retaining element, a protective device element, and a retaining element operable to couple the protective device to the bracket, is presented in accordance with certain embodiments of the present invention. This is a feature of the present invention which allows for mounting of protective device(s) to the bracket instead of the bulkhead, thereby saving space.

A power cabling assembly comprising a bracket assembly as above, a power connector, and an fastening element operable to couple the power connector to the bulkhead and the bulkhead to the bracket assembly, is presented is accordance with certain other embodiments of the present invention. This is a feature of the present invention, allowing assembly of the power cabling assembly prior to installation into target equipment.

A method for assembling the power cabling assembly, comprising a protective device coupled to a bracket, a plurality of power connector cables, a plurality of protective device cables, and a plurality of output connector cables, prior to installation in target equipment in accordance with certain embodiments of the present invention. This is a feature of the present invention, and allows assembly of power circuitry independent of the target equipment.

Figure 9:
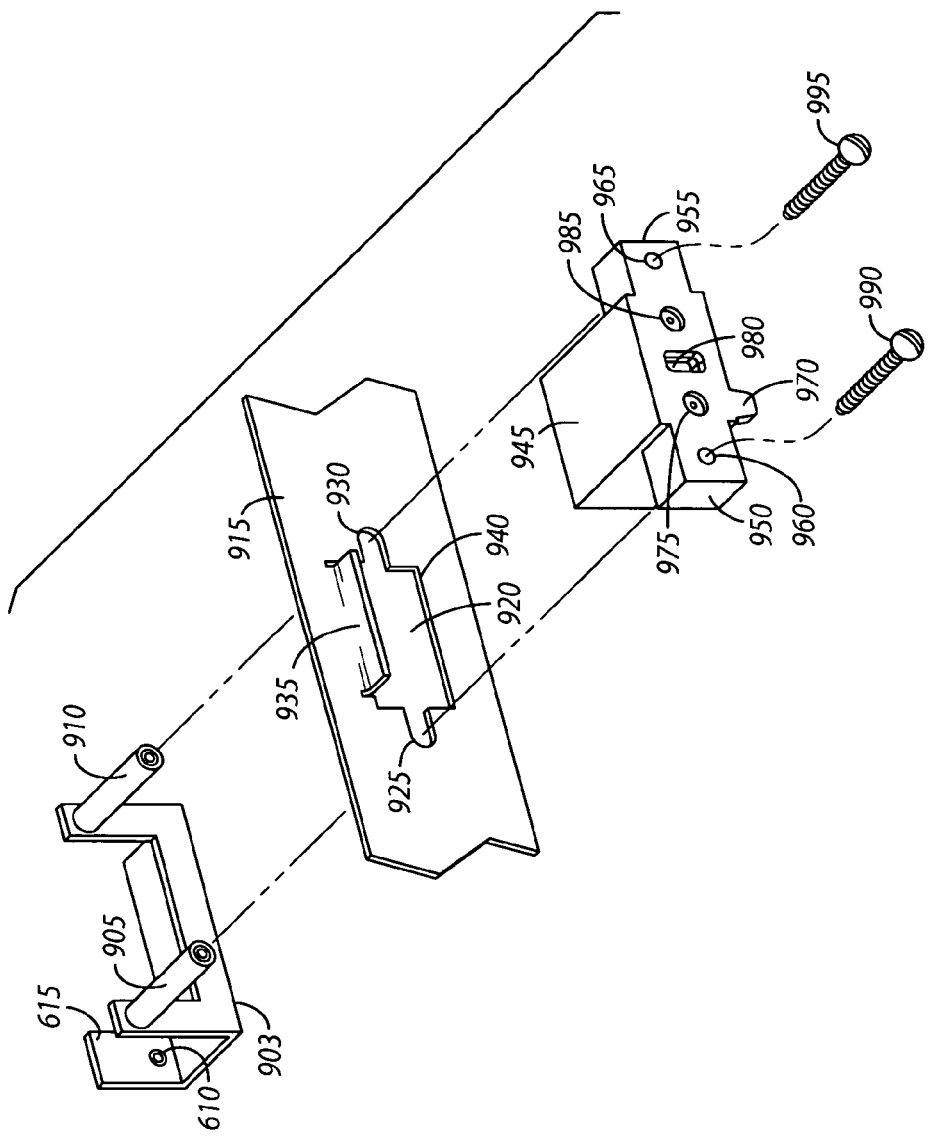
FIG. 9 is an illustration of a bracket, bulkhead, and connector for a single fuse holder in accordance with certain embodiments of the present invention.

A method for installing the power cabling assembly into the target equipment is presented, wherein a majority of power cabling assembly components, already interconnected, may be inserted through the bulkhead cutout, in accordance with certain embodiments of the present invention. This is another novel feature of the present invention, and greatly reduces the amount of labor required inside the confines of the target equipment. The present invention utilizes a connector with a companion bracket, wherein the connector is placed flush to its mounting lip on the outside of a bulkhead, with a portion of it's body which contains electrical connections fitting into a hole in the bulkhead, and a bracket is applied to the opposite side of the bulkhead. The connector body external to the bulkhead, and the bracket internal to the bulkhead, are joined by screws or other securing devices thereby firmly sandwiching the bulkhead between them (an alternate embodiment wherein the bulkhead is loosely sandwiched is described later when FIG. 9 is discussed).

Certain embodiments consistent with the present invention allow all electrical components internal to the power cabling assembly to be assembled prior to installation in the target system, assembly, or subassembly. The power cabling assembly to be inserted and the connector and bracket screwed together, and the output connector mated in one efficient operation.

In this document protective devices includes fuse holders and corresponding fuses of any type, circuit breakers both thermal and magnetic which may include a reset feature and/or delayed response, and electronic trip devices. The primary requirement for a protective device is that it be electrically and mechanically compatible with the intended application, as determined by system requirements. Since there are many different types of protective devices, the figures and discussion in this document utilized blade fuses for simplicity.

Many variations, equivalents and permutations of these illustrative exemplary embodiments of the invention will occur to those skilled in the art upon consideration of the description that follows. The particular examples above should not be considered to define the scope of the invention. For example, a plurality of output connectors may be utilized, or none may be required, wherein an alternate way of connecting, such as pigtails, may be selected, depending on the configuration. Another example of a variation which does not depart from the spirit of the invention would be orienting the protective devices differently than as shown in this document. A further example would be the stacking of protective devices where only one is depicted by way of example in this document.

While this invention is susceptible of embodiment in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals are used to describe the same, similar or corresponding parts in the several views of the drawings.

For purposes of this document, the exact dimensions and other specific parameters of components are unimportant to an understanding of the invention, and many different types of components may be utilized without departing from the spirit of the invention. An example is that protective devices, power connectors, output connectors, and cables that are utilized may be of various electrical, mechanical, and materials properties as determined most applicable for the application at hand. This document uses blade-type fuse holders, rectangular power, and rectangular output connectors by way of example only. Many variations for these constituent items will be found in the industry.

Figure 1:
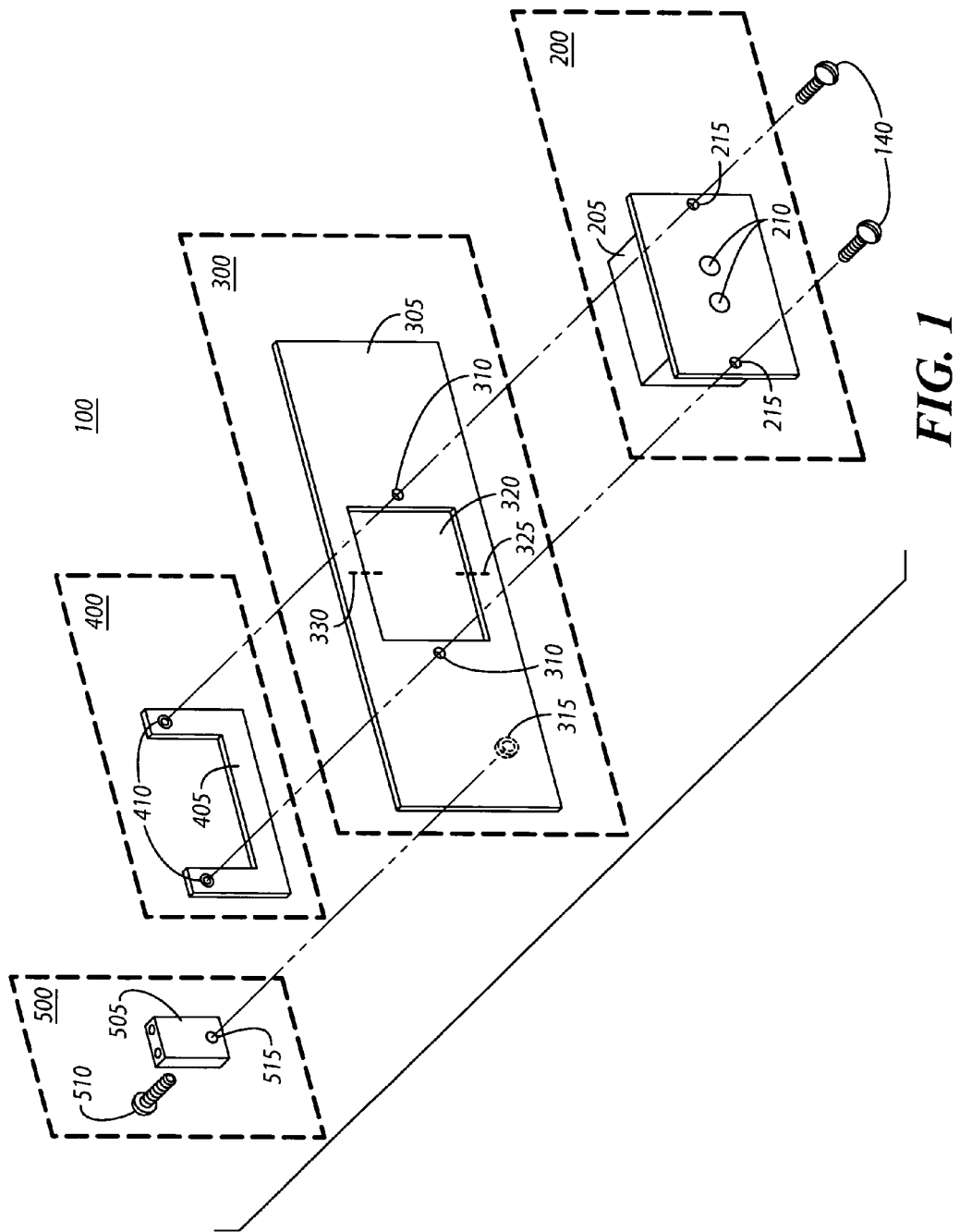
FIG. 1 is an exemplary illustration of a power connector, bracket, and bulkhead.

Turning now to FIG. 1, an example of a power connector, bracket, and bulkhead arrangement is illustrated. Such parts are used in the industry, and are shown to illustrate interrelationships. Power connector 200 is composed of power connector body 205, power connector electrical contacts 210, and power connector mounting holes 215. Power connector body 205 is commonly composed of plastic or metal or other suitable material, and the shape of power connector body 205 may be rectangular or otherwise as indicated by configuration considerations. Power connector electrical contacts 210 provide electrical continuity through power connector 200, from the front facing to the rear facing. A mating connector, not shown, mates with the front face and provides external connectivity into other equipments. Power connector mounting holes 215 allows passage of power connector and bracket securing device 140 through the connector. Power connector mounting holes 215 may consist of two or more holes or similar constructs for mounting the connector. Power connector and bracket securing device 140 as shown are most commonly used for mounting, although other means may be used such as rivets, studs, and mechanical locking inserts. Power connector and bracket securing device 140 may be constructed of metal or other suitable material. The quantity of power connector and bracket securing device 140 is as dictated by the configuration of power connector body 205.

Bulkhead 300 is composed of bulkhead mounting surface 305, bulkhead connector mounting holes 310, bulkhead connector through hole 320, and bulkhead fuse holder retaining device 315. Bulkhead mounting surface 305 is a mechanical bulkhead, with only that portion shown that is relevant to the present invention. Bulkhead mounting surface 305 may be made of metal or plastic, and the mechanical dimensions of bulkhead mounting surface 305 will depend on the application. Bulkhead connector mounting holes 310 are holes which allow for the passage of power connector and bracket securing device 140, wherein the number and arrangement of bulkhead connector mounting holes 310 is dictated by the specific configuration. Bulkhead connector through hole 320 is a mounting hole, configured to meet shape and clearance properties of power connector 200. Bulkhead fuse holder retaining device 315 provides for acceptance of fuse holder retaining device 510, and serves to mount fuse holder body 500 to the backside of bulkhead mounting surface 305. Bulkhead fuse holder retaining device 315 may consist of a threaded insert, a hole (not shown) for rivet or other attachment, or other methods specified by the configuration. Bulkhead upper material 330 and bulkhead lower material 325 represent areas of bulkhead mounting surface 305 material, above and below bulkhead connector through hole 320, and either or both may be deleted depending on configuration requirements for the overall equipment. Most common, however, is that both are present.

Connector mounting bracket 400 is composed of connector mounting bracket 405 and bracket connector fastening device 410, and is often provided by the manufacturer of power connector 200. Connector mounting bracket 405 may be constructed of metal or other suitable material, and its shape may differ from the simple u shape shown, and may be any of a variety of mechanical shapes. Bracket connector fastening device 410 are pressed-in inserts, but may be of different forms as required for the mounting of power connector 200. Bracket connector fastening device 410 accepts power connector and bracket securing device 140.

Fuse holder body 500 is configured to accept a fuse or fuses (not shown). Fuse holder body 500 may be any of varying configurations, as there are many fuse holders available in the industry depending on requirements. Fuse holder mounting hole 515 allows the fuse to be mounted to bulkhead mounting surface 305, using bulkhead fuse holder retaining device 315 and fuse holder retaining device 510. Fuse holder mounting hole 515 may consist of various arrangements, as dictated by the desired configuration. Fuse holder retaining device 510 may be of plastic or metal or other materials, and may be of various configurations depending on fuse holder mounting hole 515 and bulkhead fuse holder retaining device 315. Note that a multiplicity of fuse holders may need mounting to the backside of bulkhead mounting surface 305.

Note that space on the backside of bulkhead mounting surface 305 is used in order to mount one or more fuse holder body 500, given fuse holder retaining device 510, fuse holder mounting hole 515, and bulkhead fuse holder retaining device 315. It is a feature consistent with certain embodiments of the present invention to eliminate or reduce this lost space.

Figure 2:
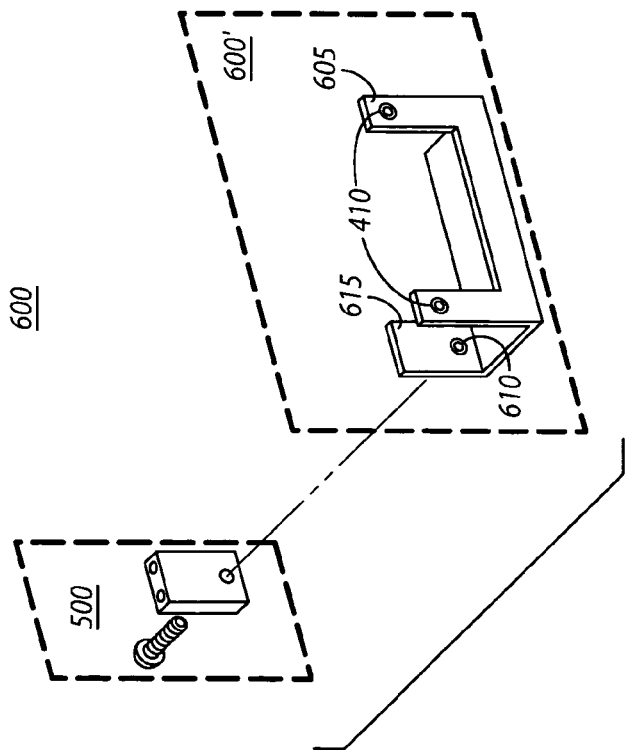
FIG. 2 is an illustration of a bracket for a single fuse holder in accordance with certain embodiments of the present invention.

Refer to FIG. 2, which is an illustration of a bracket for a single fuse holder in accordance with certain embodiments of the present invention. Bracket for single fuse holder 600' depicts an embodiment of the present invention as configured to accommodate one fuse holder, fuse holder 500. Bracket 600 differs from connector mounting bracket 400 in that bracket fuse holder mounting tab 615 has been added. Fuse holder 500 mounts to bracket fuse holder mounting tab 615, as depicted. Bracket tab fuse holder retaining device 610 accommodates mounting of fuse holder 500, in a manner analogous to bulkhead fuse holder retaining device 315. Fuse holder 500 may be any type of fuse holder that is compatible with bracket fuse holder mounting tab 615, and bracket fuse holder mounting tab 615 may be altered depending on the fuse holder selected. The overall single fuse holder bracket 605 is similar to connector mounting bracket 405, but with the changes described.

Figure 3:
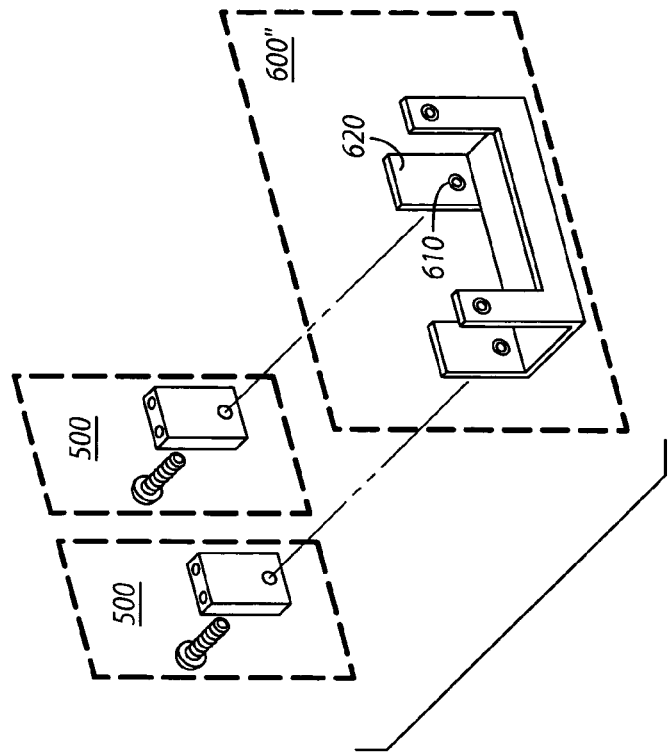
FIG. 3 is an illustration of a bracket for dual fuse holders in accordance with certain embodiments of the present invention.

FIG. 3 is an illustration of a bracket for dual fuse holders in accordance with certain embodiments of the present invention. Single fuse holder bracket for two fuse holders 600" is similar to single fuse holder 600' but with the addition of bracket fuse holder mounting tab 620. A second fuse holder fuse holder 500 may now be mounted to bracket fuse holder mounting tab 620. Fuse holder 500 may be any type of fuse holder that is compatible with bracket fuse holder mounting tab 620, and bracket fuse holder mounting tab 620 may be as required depending on the fuse holder selected. Note that each bracket fuse holder mounting tab contains a bracket fuse holder retaining device.

The present invention envisions the use of both single tab and multiple tab embodiments, wherein a tab may be any appropriate mounting surface located on the bracket to be utilized for mounting fuse holder(s). These tabs and or surfaces may be of the same or differing mechanical configurations, and the fuse holder(s) may be of the same or differing construction.

It is a feature consistent with certain embodiments of the present invention that each fuse holder that is mounted to the bracket will not have to be mounted to the bulkhead. In this way significant bulkhead space can be saved. Note also that while fuse holder mounting is accomplished external to the bulkhead, when bracket 600 and power connector 200 are installed the fuse holders are installed also.

It is a further feature of the present invention that, in the examples shown, the fuse is easily replaceable from the top side. Differing fuse holder orientations will provide differing extraction directions, as desired.

Figure 4:
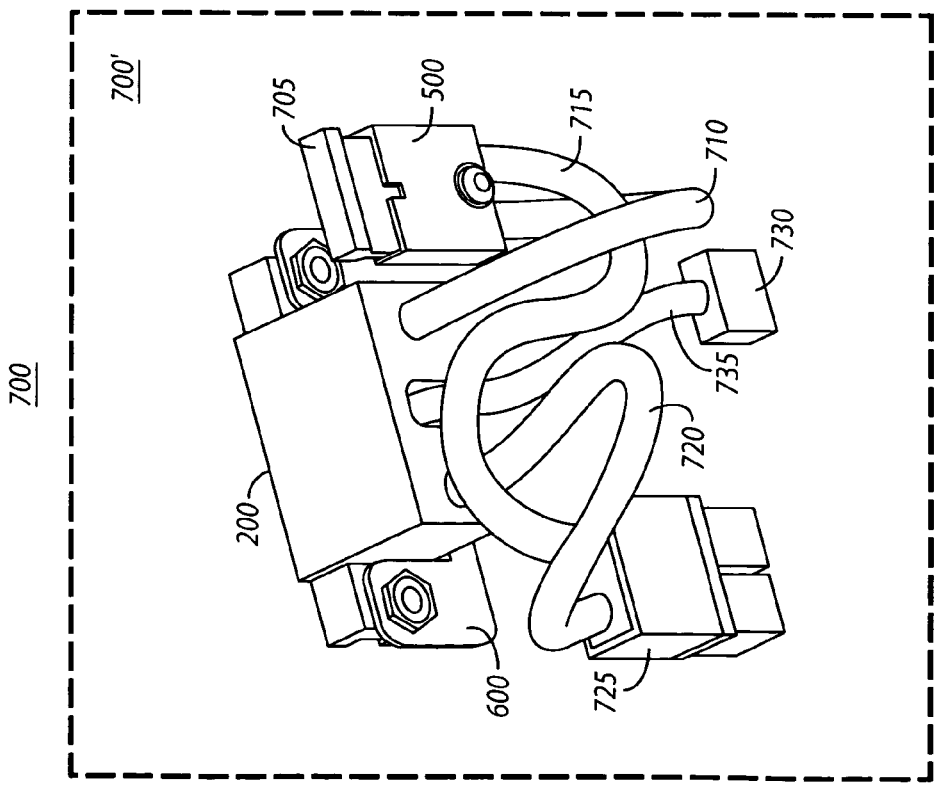
FIG. 4 is a rear view of a power cabling assembly with single fuse holder in accordance with certain embodiments of the present invention.

Refer to FIG. 4 is a rear view of a power cabling assembly with single fuse holder in accordance with certain embodiments of the present invention. Rear view power cabling assembly 700' is an exemplary rear view of a single fuse holder implementation of a power cabling assembly. Blade fuse 705 is shown for simplicity, but it may be any sort of fuse that together with fuse holder 500 is physically realizable in the configuration. Unfused low side cable 720 is routed from power connector 200 to output connector 725. Unfused hot side cable 710 is routed from power connector 200 to one side of fuse holder 500. Unfused hot side cable 710 is connected in the shortest manner possible, and may contain additional insulation to provide maximum protection against shorting. Fused hot side cable 715 is routed from the other terminal of fuse holder 500 to output connector 725. Output connector 725 may be any electrical connector, or none, as required by configuration. Other electrical connections output connector 730 may be present if additional connections, not requiring a fuse, are present, in which case other electrical connections cable 735 routes these connections to other electrical connections output connector 730. Note that the items fuse holder 500, unfused hot side cable 710, fused hot side cable 715, unfused low side cable 720, other electrical connections output connector 730, and output connector 725 are free and movable prior to installation of power cabling assembly 700, when the bracket is tightened to bulkhead mounting surface 305 and power connector 200.

Figure 5:
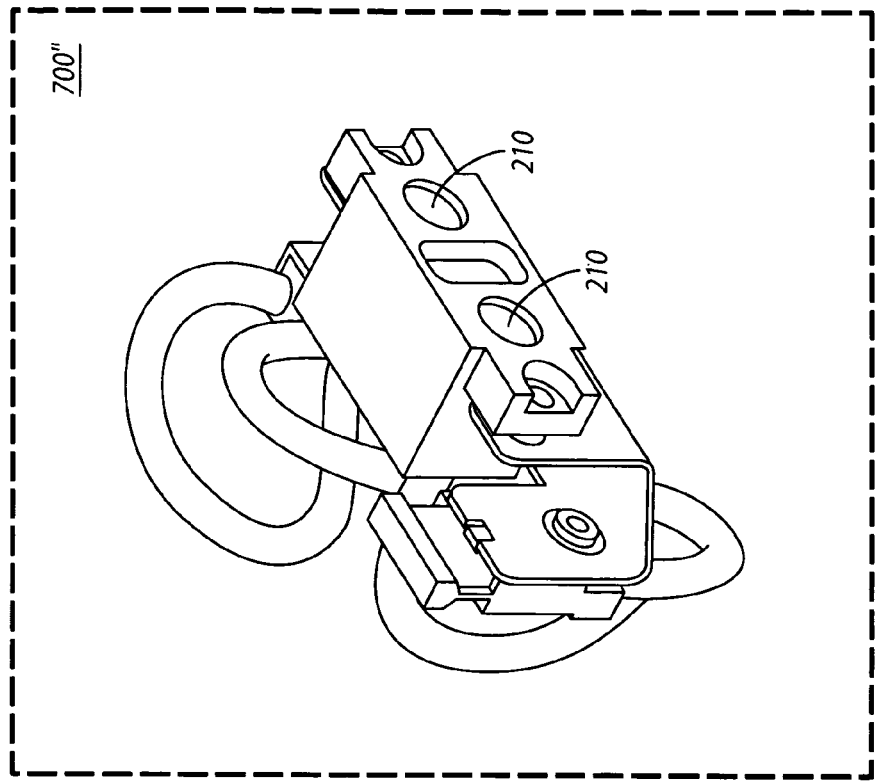
FIG. 5 is a front view of a power cabling assembly with single fuse holder in accordance with certain embodiments of the present invention.

FIG. 5 is a front view of a power cabling assembly with single fuse holder in accordance with certain embodiments of the present invention. Power cabling assembly, front view power cabling assembly 700" is an exemplary front view of power cabling assembly 700, showing power connector electrical contacts 210 which are mated externally.

It is a feature consistent with certain embodiments of the present invention that all components of power cabling assembly 700 may be assembled before installation of power cabling assembly 700 into equipment. This reduces installation labor, and lends itself to automation for manufacturing power cabling assembly 700.

It is a further feature of the present invention that, because power cabling assembly 700 has flexible elements, described previously, these flexible elements may be inserted through bulkhead connector through hole 320 as a first step in installation, with the second step being to tighten together power cabling assembly 700, bulkhead mounting surface 305, and power connector 200. This means that no hand tasks inside the equipment are required during installation, with the exception of mating output connector 725 and possibly other electrical connections output connector 730.

Note that while power cabling assembly 700 is depicted for the single fuse holder case, additional fuse holders may be utilized as discussed previously. Additionally, the shape and number of contacts of power connector 200 may be varied, as can the size and characteristics of wiring. Output connector 725 and other electrical connections output connector 730 may consist of one connector each or a plurality of connectors, as required by configuration. These changes are contained within the spirit of the invention.

Figure 6:
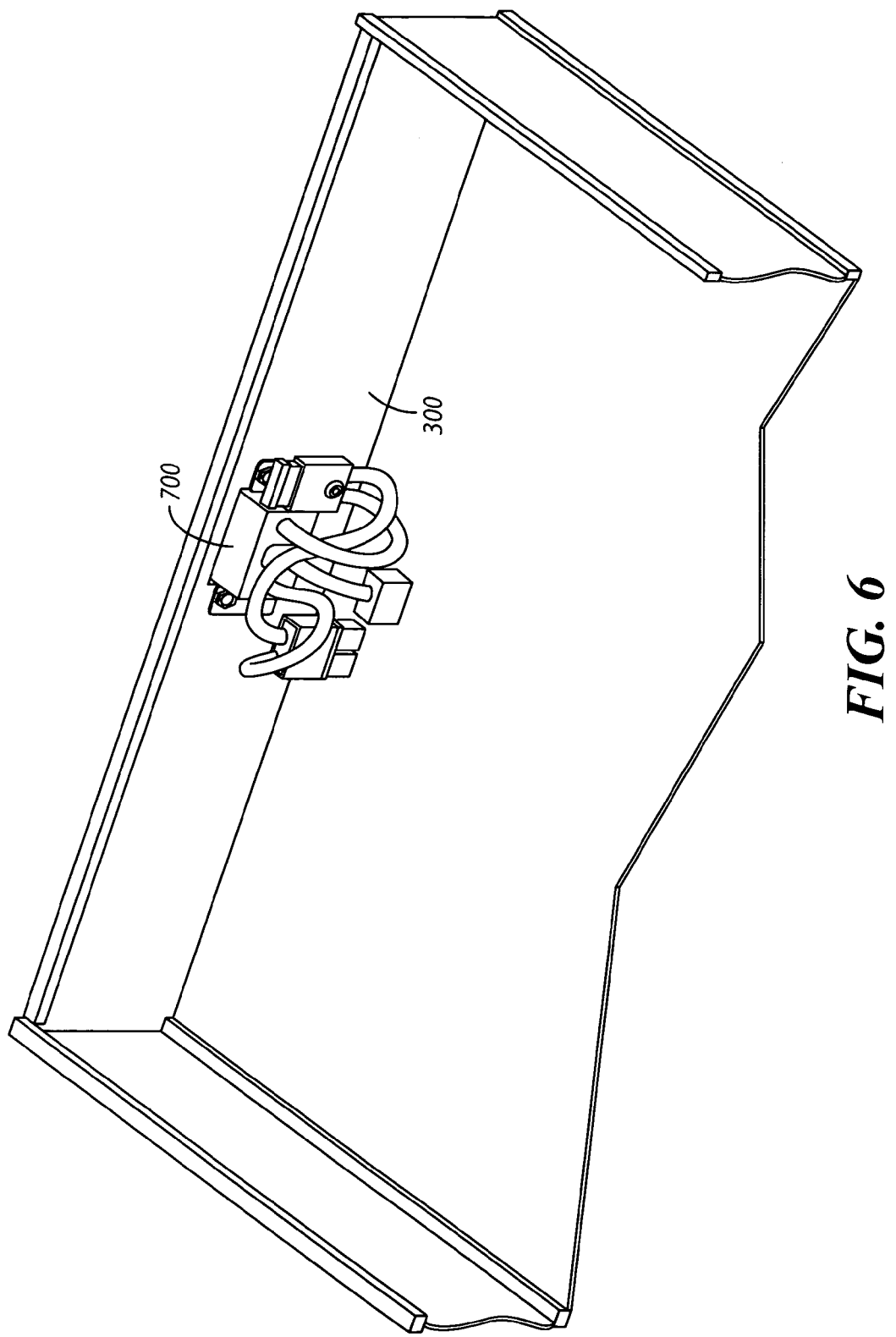
FIG. 6 is a Power Cabling Assembly in accordance with certain embodiments of the present invention.

Reference FIG. 6, which depicts an overall view of a chassis with power cabling assembly 700 installed.

FIG. 7 illustrates one assembly sequence for the power cabling assembly, in accordance with certain embodiments of the present invention, discussed at length above. In block 810 appropriate cables are coupled to the power connector. At block 820 appropriate cables are coupled to the fuse holder (s). At block 830 appropriate cables are coupled to the output connector(s). At block 840 the fuse holder(s) is mounted to the bracket. Block 850 allows for assembly testing as required. Block 860 indicates that, after any testing, the power cabling assembly is complete. Note that insertion of fuses may or may not be done at this point, depending on manufacturing requirements. Various alterations of this procedure may be used without departing from the spirit and scope of the invention.

FIG. 8 illustrates one assembly sequence for insertion of a completed power cabling assembly into target equipment in accordance with certain embodiments of the present invention, previously described. Block 910 indicates that a completed power cabling assembly is available. Block 920 means that the target equipment bulkhead must be identified. Block 930 shows that the first step is to insert output connector(s) through the bulkhead. At block 940 the bracket with mounted fuse holder(s) is inserted through the bulkhead. Block 950 allows for securing the power connector to the bracket assembly. Doing so will sandwich the bulkhead between them. Block 960 indicates the final step of mating output connectors. Various alterations of this procedure may be used without departing from the spirit of the invention.

Referring to FIG. 9, which is an illustration of a bracket, bulkhead, and connector for a single fuse holder in accordance with certain embodiments of the present invention, bracket fuse holder mounting tab 615 and bracket tab fuse holder retaining device 610 are as described before except they are now part of mounting bracket 903. Mounting bracket 903 consists additionally of standoffs 905 and 910. Bulkhead 915 contains cutout 920, which is not a simple rectangle but consists of top flange 935, bottom 940, standoff 905 pass-through 925, and standoff 910 pass-through 930. Standoffs 905 and 910 are of lesser diameters than standoff pass-throughs 925 and 930, respectively. Connector body 945 consists of mounting tabs 950 and 955, mounting tab through holes 960 and 965, electrical connections 975 and 985, alignment receptacle 980, and tab 970. Attaching device 990 passes through through-hole 960, and engages standoff 905. Attaching device 995 passes through through-hole 965 and engages standoff 910.

Alignment receptacle 980 is utilized to self justify connector 945 to its mating connector, not shown. This is required for proper engagement of the two connectors. When connector 945 is assembled properly, tab 970 will not interfere with the bulkhead or any other surrounding part. If connector is inserted in an inverted manner, tab 970 will contact flange 935 and connector 945 will not insert sufficiently for attaching devices 990 and 995 to engage standoffs 905 and 910, respectively. When connector 945 is assembled, the back sides of mounting tabs 950 and 955 will limit the extent of insertion into cutout 920 by contacting the outward facing bulkhead surface near cutout 925 and 930, respectively.

Front-back float is provided by making the height of standoffs 905 and 910 (above the front surface of bracket 903) greater than the thickness of bulkhead 915. Up-down float is achieved by selecting the vertical height of connector 945, exclusive of tab 970, to be less that the vertical clearance of cutout 920 in conjunction with selecting the diameter of cut outs 925 and 930 greater than the diameter of standoffs 905 and 910. Left-right float is accomplished by selecting the width of connector 945 to be less than the horizontal clearance of cutout 920 in conjunction with selecting the combination of diameter of cut outs 925 and 930 and horizontal distance between cut outs 925 and 930 greater than the combination of diameter of standoffs 905 and 910 and horizontal distance between standoffs. Attachment devices 990 and 995 may be screws or snaps, and standoffs may be configured to accept either as required.

Those skilled in the art will appreciate that many other circuit and mechanical configurations can be readily devised to accomplish the desired end without departing from the spirit of the present invention.

While the invention has been described in conjunction with specific embodiments, it is evident that many alternatives, modifications, permutations and variations will become apparent to those of ordinary skill in the art in light of the foregoing description. By way of example, the orientation of the fuse holders may be changed without departing from the invention. Many other variations are also possible. Accordingly, it is intended that the present invention embrace all such alternatives, modifications and variations as fall within the scope of the appended claims.

What is claimed is:

1. A power cabling assembly, comprising:
    a bracket assembly having at least one electrical protective device integral thereto;
    a power connector; and
    a bracket power connector fastening element operable to couple the power connector to a bulkhead and the bulkhead to the bracket assembly,
    wherein the bracket assembly further comprises a protective device mounting portion to which the protective device is coupled by a protective device retaining element and wherein the power cabling assembly further comprises first and second cables coupled to the power connector and a plurality of cables coupled to the protective device.

2. The bracket assembly of claim 1, wherein the protective device mounting portion is a tab portion of the bracket assembly.

3. The bracket assembly of claim 1, wherein the bracket assembly further comprises a bulkhead mounting portion operable to attach to a bulkhead surface and wherein the protective device mounting portion is not in contact with the bulkhead mounting portion of the bracket assembly.

4. The bracket assembly of claim 1, wherein the protective device mounting portion of the bracket assembly further comprises a protective device mounting element that in cooperation with the protective device retaining element couples the protective device to the bracket assembly.

5. The bracket assembly of claim 1, wherein the protective device further comprises first and second protective devices, the protective device mounting portion further comprises first and second tab portions of the bracket assembly, and wherein the protective device retaining element further comprises a first protective device retaining portion operable to couple the first protective device to the first tab portion and a second protective device retaining portion operable to couple the second protective device to the second tab portion.

6. The bracket assembly of claim 1 wherein the protective device comprises a plurality of protective devices.

7. The power cabling assembly of claim 1, wherein said assembly may be inserted through a receiving portion of the bulkhead with the exception of a portion of the power connector remaining external to the bulkhead.

8. The power cabling assembly of claim 1, wherein the power cabling assembly further comprises first and second output connectors coupled to a plurality of cables of said assembly.

9. A power cabling assembly, comprising:
a bracket assembly having at least one electrical protective device integral thereto;
a power connector; and
a bracket power connector fastening element operable to couple the power connector to a bulkhead and the bulkhead to the bracket assembly,
wherein the bracket assembly further comprises a protective device mounting portion to which the protective device is coupled by a protective device retaining element and wherein the power cabling assembly further comprises first and second cables coupled to the protective device.

10. The bracket assembly of claim 9, wherein the protective device mounting portion is a tab portion of the bracket assembly.

11. The bracket assembly of claim 9, wherein the bracket assembly further comprises a bulkhead mounting portion operable to attach to a bulkhead surface and wherein the protective device mounting portion is not in contact with the bulkhead mounting portion of the bracket assembly.

12. The bracket assembly of claim 9, wherein the protective device mounting portion of the bracket assembly further comprises a protective device mounting element that in cooperation with the protective device retaining element couples the protective device to the bracket assembly.

13. The bracket assembly of claim 9, wherein the protective device further comprises first and second protective devices, the protective device mounting portion further comprises first and second tab portions of the bracket assembly, and wherein the protective device retaining element further comprises a first protective device retaining portion operable to couple the first protective device to the first tab portion and a second protective device retaining portion operable to couple the second protective device to the second tab portion.

14. The bracket assembly of claim 9, wherein the protective device comprises a plurality of protective devices.

15. The power cabling assembly of claim 9, wherein said assembly may be inserted through a receiving portion of the bulkhead with the exception of a portion of the power connector remaining external to the bulkhead.

16. The power cabling assembly of claim 9, wherein the power cabling assembly further comprises first and second output connectors coupled to a plurality of cables of said assembly.

17. A power cabling assembly, comprising:
a bracket assembly having at least one electrical protective device integral thereto;
a power connector; and
a bracket power connector fastening element operable to couple the power connector to a bulkhead and the bulkhead to the bracket assembly,
wherein the bracket assembly further comprises a protective device mounting portion to which the protective device is coupled by a protective device retaining element,
wherein said assembly may be inserted through a receiving portion of a bulkhead, with first and second cables of a plurality of cables of said assembly coupled to the power connector, fourth third and fourth cables of the plurality of cables coupled to the protective device element, first and second output connectors coupled to the plurality of cables, and a protective device mounting portion to which the protective device is coupled by the means for coupling, wherein the protective device mounting portion is a tab portion of the bracket assembly, wherein the bracket assembly further comprises a bulkhead mounting portion operable to attach to a bulkhead surface, and wherein the protective device mounting portion is not in contact with the bulkhead mounting portion of the bracket assembly.

18. The bracket assembly of claim 17, wherein the protective device mounting portion is a tab portion of the bracket assembly.

19. The bracket assembly of claim 17, wherein the bracket assembly further comprises a bulkhead mounting portion operable to attach to a bulkhead surface and wherein the protective device mounting portion is not in contact with the bulkhead mounting portion of the bracket assembly.

20. The bracket assembly of claim 17, wherein the protective device mounting portion of the bracket assembly further comprises a protective device mounting element that in cooperation with the protective device retaining element couples the protective device to the bracket assembly.

21. The bracket assembly of claim 17, wherein the protective device further comprises first and second protective devices, the protective device mounting portion further comprises first and second tab portions of the bracket assembly, and wherein the protective device retaining element further comprises a first protective device retaining portion operable to couple the first protective device to the first tab portion and a second protective device retaining portion operable to couple the second protective device to the second tab portion.

22. The bracket assembly of claim 17, wherein the protective device comprises a plurality of protective devices.

23. The power cabling assembly of claim 17, wherein said assembly may be inserted through a receiving portion of the bulkhead with the exception of a portion of the power connector remaining external to the bulkhead.

24. The power cabling assembly of claim 17, wherein the power cabling assembly further comprises first and second output connectors coupled to a plurality of cables of said assembly.

* * * * *